US012652769B2

(12) United States Patent
Chien

(10) Patent No.: US 12,652,769 B2
(45) Date of Patent: Jun. 9, 2026

(54) TRAY HANDLE DESIGN WITH MULTIPLE FUNCTIONS

(71) Applicant: DELL PRODUCTS L.P., Round Rock, TX (US)

(72) Inventor: Tung-Yu Chien, Zhonhe Dist. (TW)

(73) Assignee: Dell Products L.P., Round Rock, TX (US)

( * ) Notice: Subject to any disclaimer, the term of this patent is extended or adjusted under 35 U.S.C. 154(b) by 444 days.

(21) Appl. No.: 18/361,858

(22) Filed: Jul. 30, 2023

(65) Prior Publication Data

US 2025/0040070 A1      Jan. 30, 2025

(51) Int. Cl.
*H05K 7/14* (2006.01)
*H05K 5/02* (2006.01)

(52) U.S. Cl.
CPC ........... *H05K 5/023* (2013.01); *H05K 5/0221* (2013.01); *H05K 7/1421* (2013.01)

(58) Field of Classification Search
CPC .... H05K 5/023; H05K 5/0221; H05K 7/1421; H05K 7/1487
See application file for complete search history.

(56) References Cited

U.S. PATENT DOCUMENTS

| | | | |
|---|---|---|---|
| 9,456,519 | B2 | 9/2016 | Bailey et al. |
| 10,039,204 | B2 | 7/2018 | Kyle et al. |
| 11,310,932 | B2 * | 4/2022 | Chang ...................... H05K 7/16 |
| 12,222,778 | B2 * | 2/2025 | Ku ........................ H05K 7/1489 |
| 2023/0049413 | A1 * | 2/2023 | Tan ...................... H05K 7/1489 |
| 2025/0036172 | A1 * | 1/2025 | Zhong ..................... G06F 1/183 |

* cited by examiner

*Primary Examiner* — Amy J. Sterling
(74) *Attorney, Agent, or Firm* — Larson Newman, LLP

(57) ABSTRACT

A planar module tray includes a bottom panel, first and second side panels, and a handle. The first side panel is in physical communication with a first edge of the bottom panel. The second side panel is in physical communication with a second edge of the bottom panel. The handle is in physical communication with and securely mounted on both of the first and second side panels. The handle transitions between a horizontal position and a vertical position. When the handle is in the horizontal position, the handle is in physical communication with the bottom panel. When the handle is in the vertical position, the handle is perpendicular to the bottom panel.

19 Claims, 7 Drawing Sheets

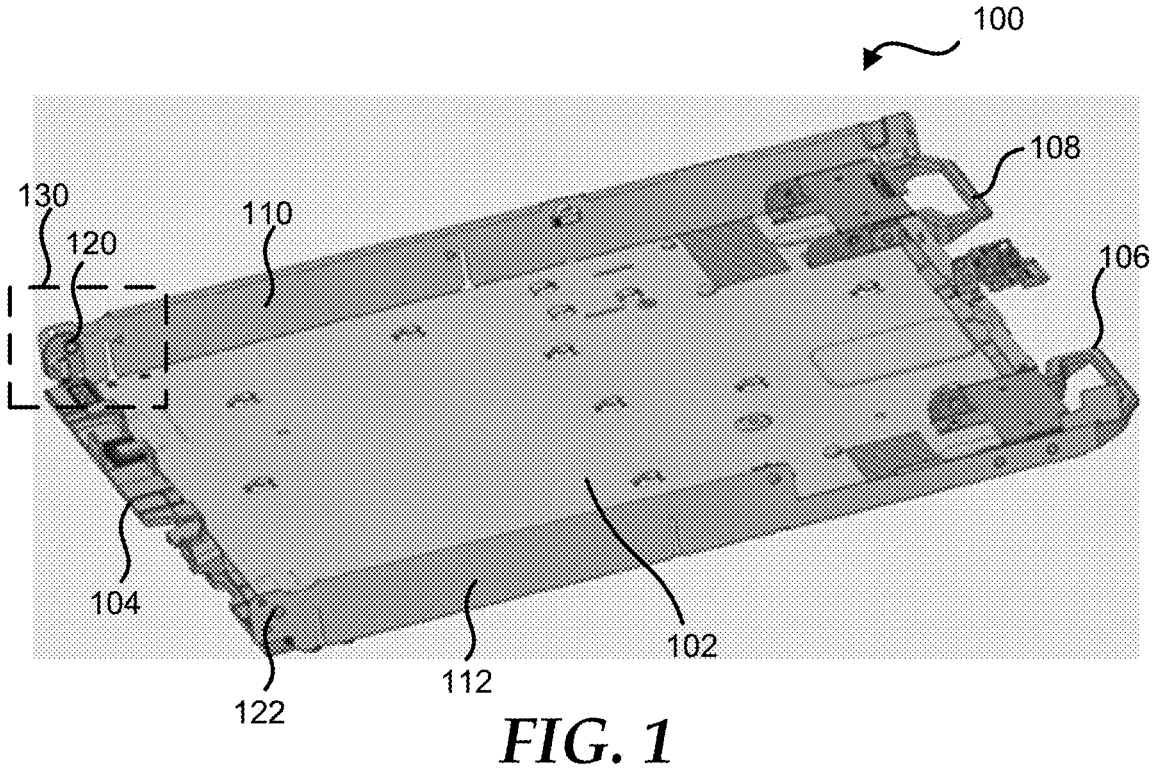
FIG. 1
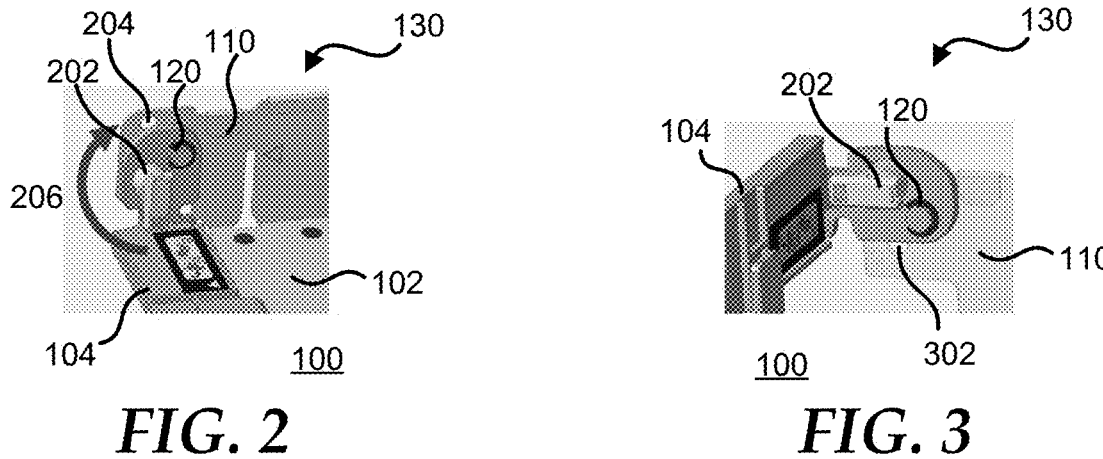
FIG. 2          FIG. 3

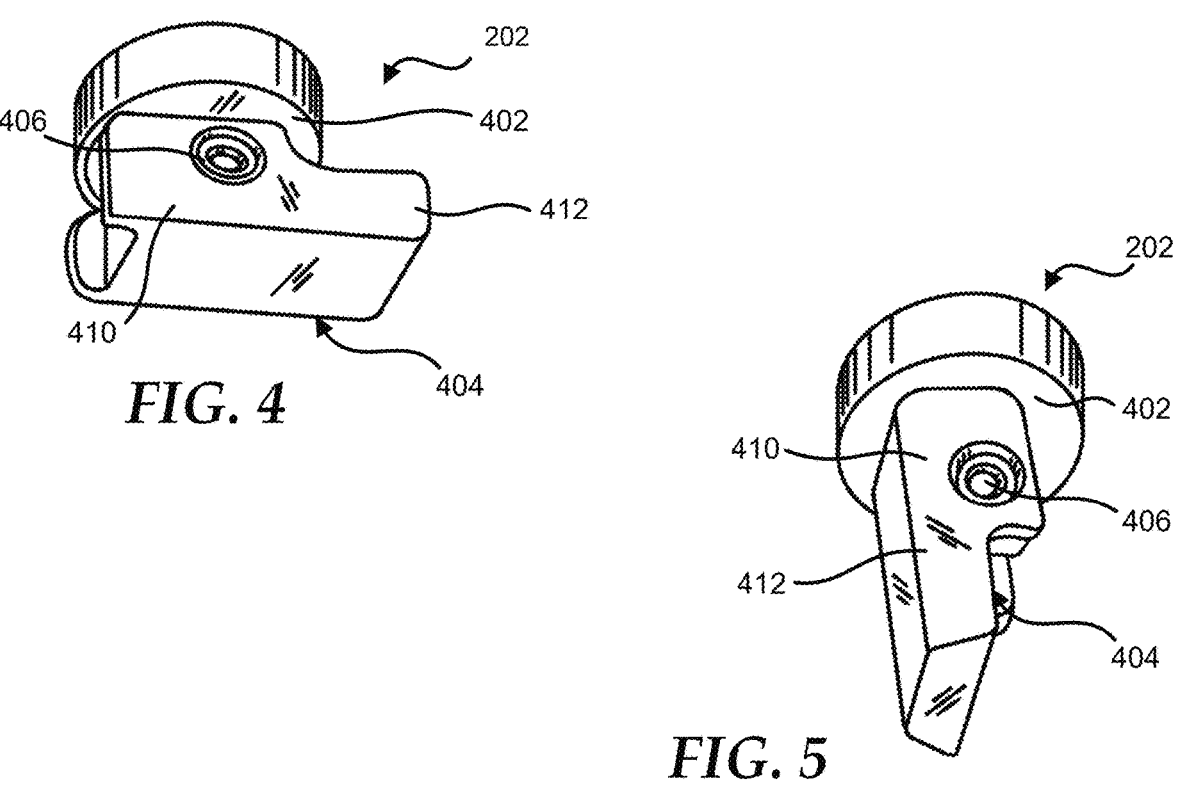
FIG. 4
FIG. 5
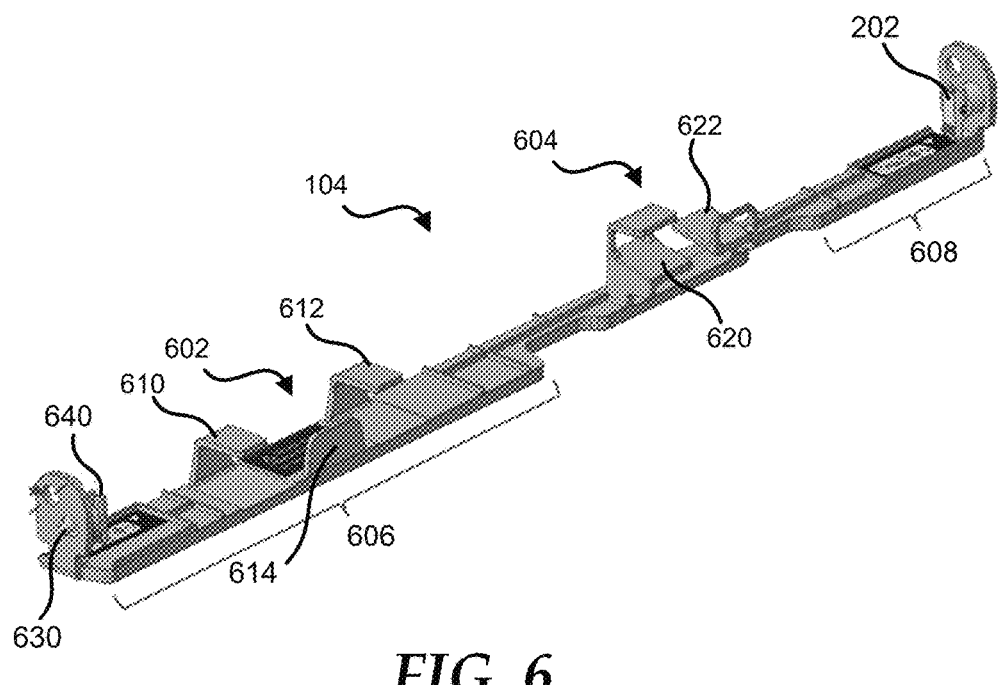
FIG. 6

TRAY HANDLE DESIGN WITH MULTIPLE FUNCTIONS

FIELD OF THE DISCLOSURE

The present disclosure generally relates to information handling systems, and more particularly relates to a tray handle design with multiple functions.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A planar module tray includes a bottom panel, first and second side panels, and a handle. The first side panel is in physical communication with a first edge of the bottom panel. The second side panel is in physical communication with a second edge of the bottom panel. The handle is in physical communication with and securely mounted on both of the first and second side panels. The handle may transition between a horizontal position and a vertical position. When the handle is in the horizontal position, the handle is in physical communication with the bottom panel. When the handle is in the vertical position, the handle is perpendicular to the bottom panel.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 1 is a perspective view of a planar module tray for an information handling system according to at least one embodiment of the present disclosure;

FIGS. 2 and 3 are diagrams of a portion of a planar module tray according to at least one embodiment of the present disclosure;

FIGS. 4 and 5 are diagrams of a plunger lock for a planar module tray according to at least one embodiment of the present disclosure;

FIG. 6 is a perspective view of a handle for a planar module tray according to at least one embodiment of the present disclosure;

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 12:
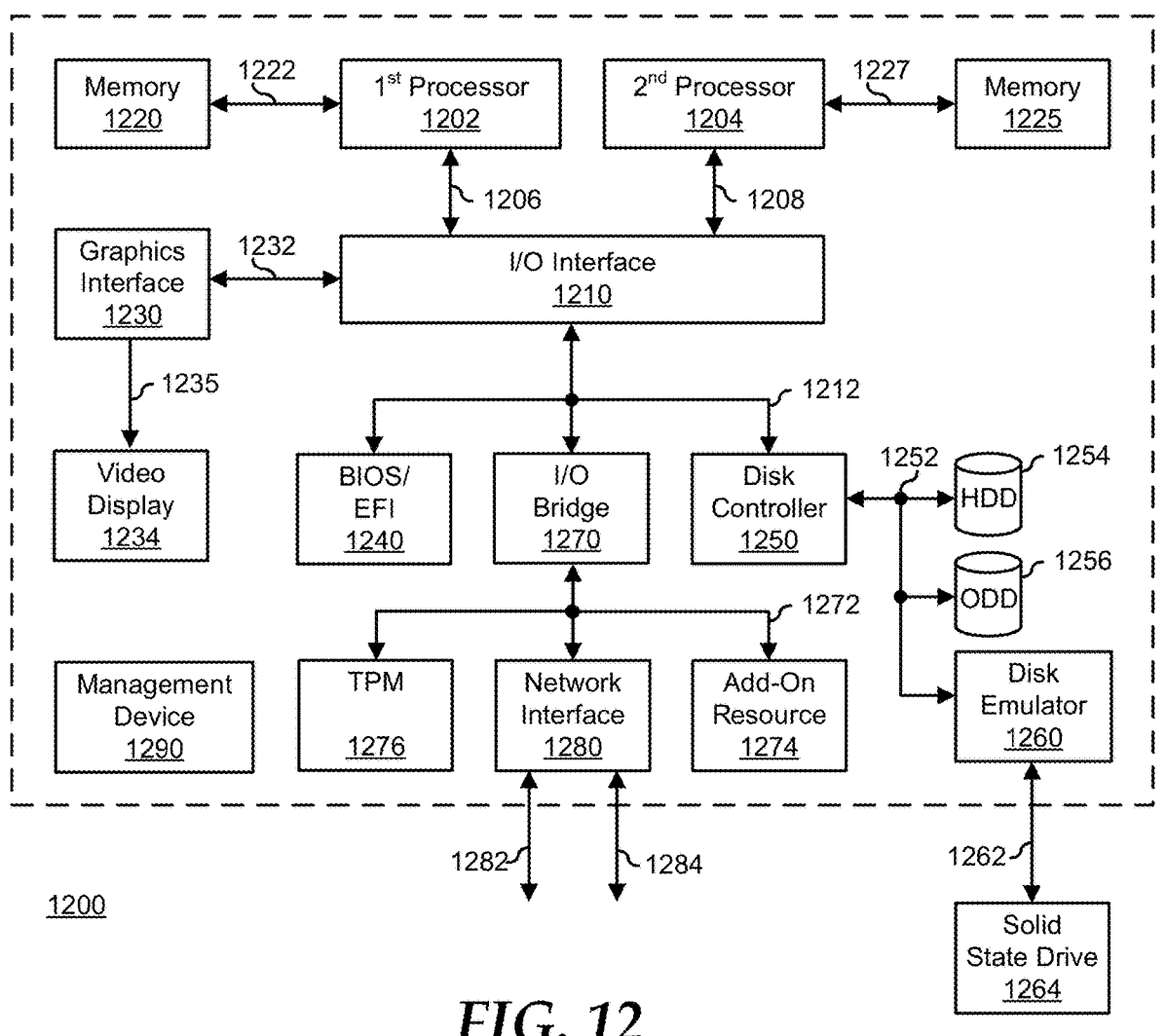
FIG. 12 is a block diagram of a general information handling system according to an embodiment of the present disclosure.

FIG. 1 illustrates a planar module tray 100 for an information handling system, such as information handling system 1200 of FIG. 12, according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Planar module tray 100 includes a bottom panel 102, a handle 104, back handles 106 and 108, and side panels 110 and 112. Handle 104 is connected to side panel 110 via a component 120 and connected to side panel 112 via a component 122. In an example, components 120 and 122 may be any suitable fastener, such as a rivet, a bolt with a locking washer, or the like. Side panels 110 and 112 extend substantially perpendicular away from bottom panel 102, and the side panels are located on opposite sides of the bottom panel. Handles 106 and 108 are in physical communication with bottom panel 102 and handles 106 and 108 are located at a distal or opposite edge of the bottom panel as compared to handle 104. Handle 104 may transition between a horizontal position and a vertical position as will be described with respect to portion 130 in FIGS. 2 and 3 below. Planar module tray 100 may include additional components without varying from the scope of this disclosure.

FIGS. 2 and 3 illustrate portion 130 of planar module tray 100 according to at least one embodiment of the present disclosure. Planar module tray 100 further includes a plunger lock 202 and locking holes 204 and 302. In an example, component 120 may secure handle 104 to side panel 110 and provide a rotational point as the handle transitions between the horizonal state illustrated in FIG. 2 and the vertical position illustrated in FIG. 3.

In an example, plunger lock 202 may hold handle 104 in the horizontal position when the plunger lock is engaged with locking hole 302. In this situation, a surface of handle 104 may be held in physical communication with bottom panel 102 as illustrated in FIG. 2. While handle 104 is in the horizontal position and plunger lock 202 is in a locked position, a pin of the plunger lock may extend through locking hole 302 to hold the handle in the horizontal position. In an example, plunger lock 202 may transition from the locked position to an unlocked position, as will be described with respect to FIGS. 4 and 5 below, so that handle 202 may move or transition from the horizontal position to the vertical position. For example, handle 104 may rotate around component 120 and in the direction of arrow 206 to move or transition from the horizontal position to the vertical position.

After handle 104 is rotated in the direction of arrow 206, the handle may be in the horizontal position as shown in FIG. 3. When handle 104 is in the horizontal position, plunger lock 202 may be placed in the locked position, such that the pin of the plunger extends through locking hole 206. Based on the pin of plunger lock 202 being within locking hole 206, the plunger lock may secure handle 104 in the horizontal position. While the movement and locking of handle 104 has been described with respect to side panel 110 and component 120, the handle may interface in substantially the same manner with respect to side panel 112 and component 122. For example, side panel 112 may include two locking holes to interface with a plunger lock 640 in FIG. 6 as described above with respect to plunger lock 202 and locking holes 204 and 302.

FIGS. 4 and 5 illustrates plunger lock 202 for planar module tray 100 of FIG. 1 according to at least one embodiment of the present disclosure. Plunger lock 202 includes a base 402, a head 404, and a pin attachment 406. Head 404 includes a main body 410 and a tab 412. Pin attachment 406 is located within main body 410 and may connect the main body to a pin, such as pin 630 of FIG. 6.

Referring now to FIG. 4, plunger lock 202 is in a locked position and head 404 is perpendicular to base 402. While plunger lock 202 is in the locked position, a section of main body 410 having pin attachment 406 may be located near base 402 so that a pin may extend through one of the locking holes in planar module tray 100. In an example, a force may be exerted on a first surface of tab 412 to transition plunger lock 202 from the locked position to an unlocked position.

Referring now to FIG. 5, plunger lock 202 is in the unlocked position and head 404 is substantially parallel to base 402. While plunger lock 202 is in the unlocked position, the section of main body 410 having pin attachment 406 may be located away from base 402 so that a pin does not extend through one of the locking holes in planar module tray 100. In an example, a force may be exerted on a second surface of tab 412 to transition plunger lock 202 from the unlocked position to the locked position. In certain examples, plunger lock 202 may be connected on both ends of handle 104 as illustrated in FIG. 6.

FIG. 6 illustrates handle 104 to at least one embodiment of the present disclosure. Handle 104 includes cable routing components 602 and 604 and air sealing tabs 606 and 608. Cable routing component 602 includes mounts 610, 612, and 614. Cable routing component 604 includes mounts 620 and 622.

Mount 610 includes a first portion that extends substantially perpendicularly away from a first edge of handle 104, and a second portion that extends substantially perpendicularly away from the first portion. In an example, the second portion of mount 610 may be substantially parallel to handle 104, such that a cable routing location is formed in a 'C' shape by handle 104, and the first and second portions of mounts 610.

Mount 612 includes a first portion that extends substantially perpendicularly away from the first edge of handle 104, and a second portion that extends substantially perpendicularly away from the first portion. In an example, the second portion of mounts 612 may be substantially parallel to handle 104, such that a cable routing location is formed in a 'C' shape by handle 104, and the first and second portions of mounts 612. Mount 614 is located on a second edge of handle 104 that is distal or opposite of the first edge. In an example, the second edge of handle 104 may be an edge of sealing tab 606. Mount 614 is positioned substantially equidistance from mounts 610 and 612. In an example, cables 702, 704 and 706, illustrated in FIG. 7, may be routed in any particular direction or directions through routing component 602 and held in place by mounts 610, 612, and 614.

Mount 620 of routing component 604 includes a first portion that extends substantially perpendicularly away from a first edge of handle 104, and a second portion that extends substantially perpendicularly away from the first portion. In an example, the second portion of mounts 620 may be substantially parallel to handle 104, such that a cable routing location is formed in a 'C' shape by handle 104, and the first and second portions of mounts 620. Mount 620 also includes a third portion located on top of the second portion, and the third portion may form 'C' shape with an opening to route cables through mount 620.

Mount 622 includes a first portion that extends substantially perpendicularly away from the first edge of handle 104, and a second portion that extends substantially perpendicularly away from the first portion. In an example, the second portion of mount 622 may be substantially parallel to handle 104, such that a cable routing location is formed in a 'C' shape by handle 104, and the first and second portions of mounts 622. Mount 622 also includes a third portion located on top of the second portion, and the third portion may include an opening to route cables through mount 622.

Figure 7:
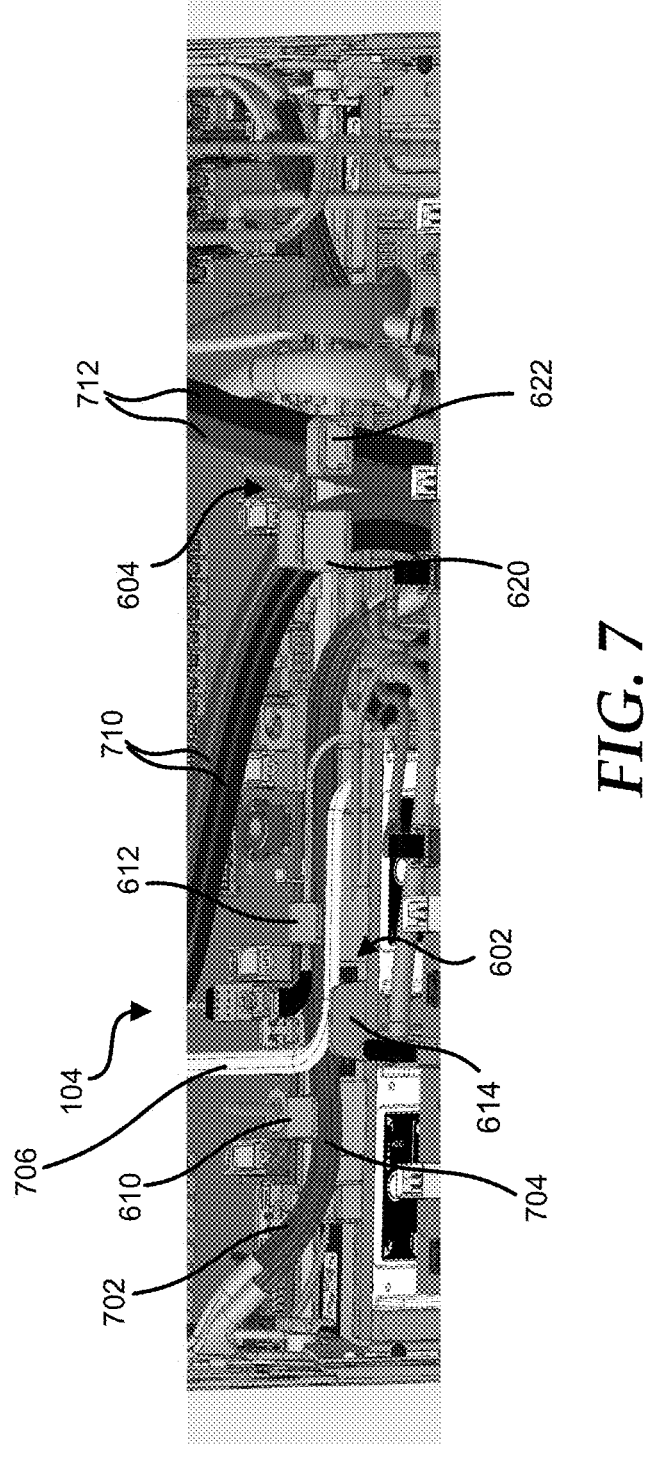
FIG. 7 is a diagram of cable routing in a handle of a planar module tray according to at least one embodiment of the present disclosure.

In an example, cables 710 and 712, illustrated in FIG. 7, may be routed any particular direction or directions through routing component 604 and held in place by mounts 620 and 622. In certain examples, cables 702, 704, 706, 710, and 712 of FIG. 7 may be any suitable type of cable or tubing including, but not limited to, liquid cooling tubing, power cables, and communication cables.

Figure 8:
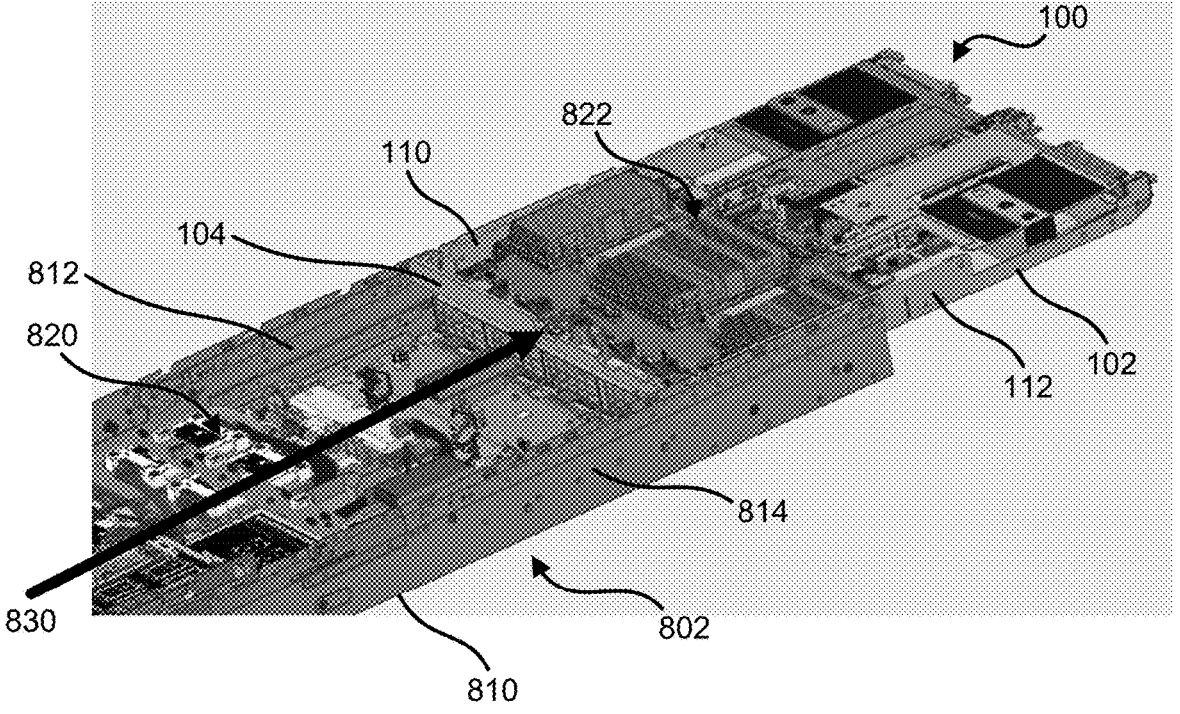
FIGS. 8 and 9 are perspective views of a planar module tray and a bottom module tray according to at least one embodiment of the present disclosure.
Figure 9:
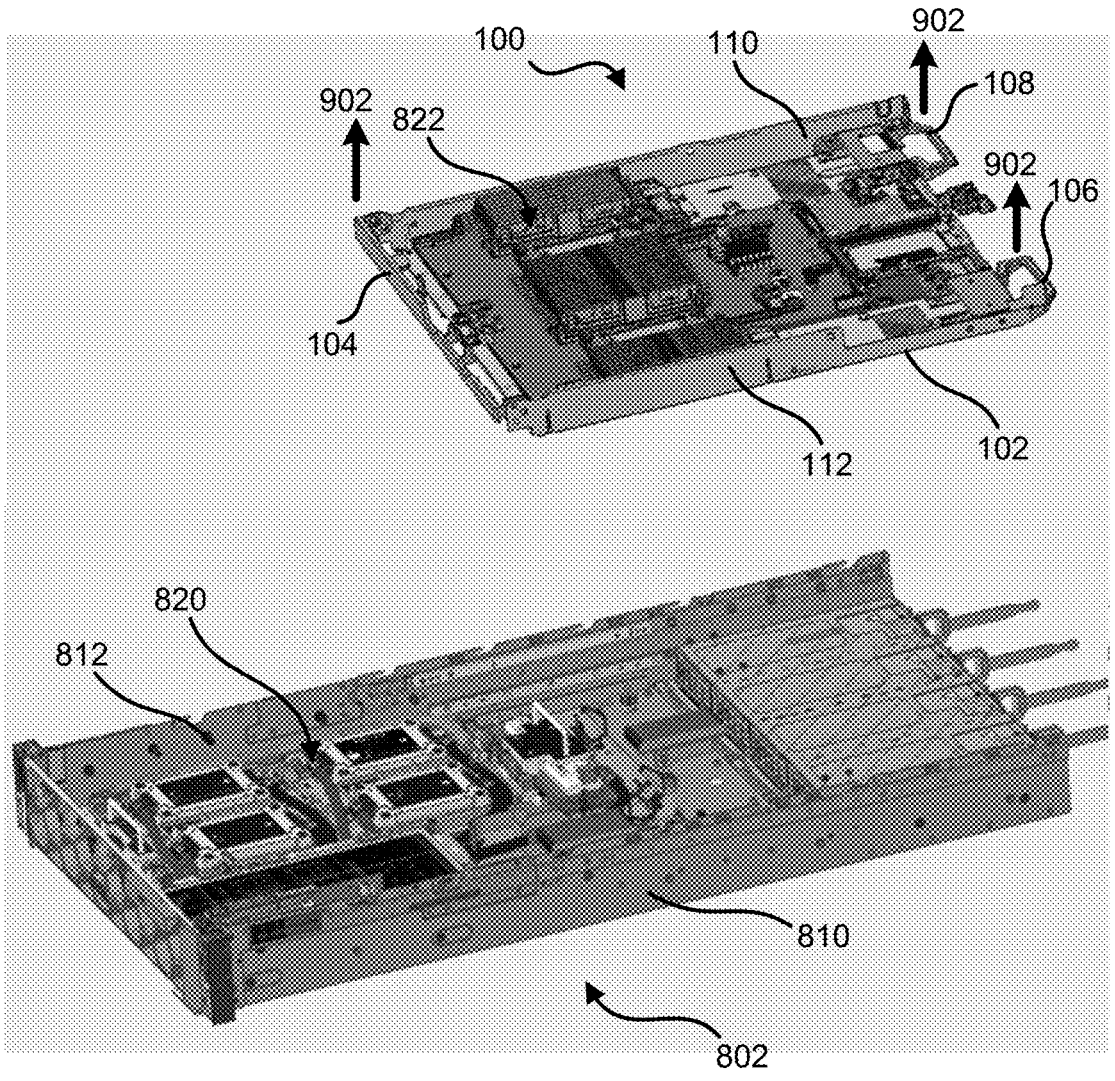

FIGS. 8 and 9 illustrates a bottom module tray 802 and planar module tray 100 according to at least one embodiment of the present disclosure. Bottom module tray includes a bottom panel 810 and side panels 812 and 814. Bottom module tray 802 may hold multiple components 820, and planar module tray 100 may hold multiple components 822. In an example, planar module tray 100 may fit within side panels 812 and 814 of bottom module tray 802. In this example, when planar module tray 100 is located within bottom module tray 802, side panel 110 may be in physical communication with side panel 812, side panel 112 may be in physical communication with side panel 814, and bottom panel 102 may be located above components 820 within bottom module tray 802.

Referring to FIG. 8, handle 104 may be utilized in utilized during a horizontal removal of planar module tray 100 from bottom module tray 802. In an example, handle 104 may be placed in the vertical position, and an individual may exert a force on the handle in the direction of arrow 830. The force on handle 104 may be transferred to side panels 110 and 112 and bottom panel 102 such that planar module tray 100 may be removed from bottom module tray 802 in the direction of arrow 830.

Referring to FIG. 9, handles 104, 106 and 108 may be utilized in utilized during a vertical removal of planar module tray 100 from bottom module tray 802. In an example, handle 104 may be placed in the vertical position, and an individual may exert a force on handles 104, 106, and 108 in the direction of arrows 902. The force on handles 104, 106, and 108 may be transferred to side panels 110 and 112 and bottom panel 102 such that planar module tray 100 may be removed from bottom module tray 802 in the direction of arrows 902.

Figure 10:
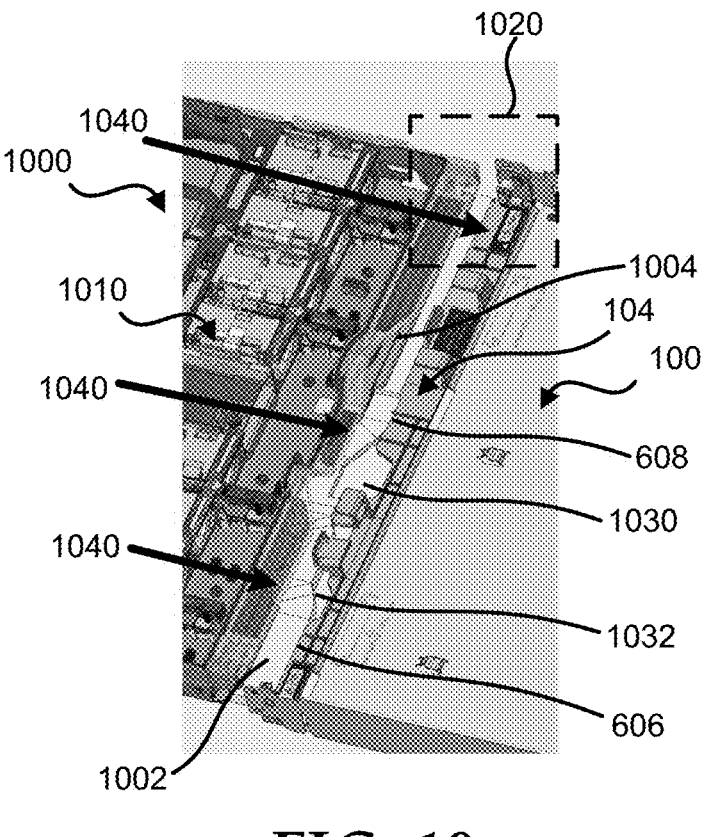
FIG. 10 is a perspective view of a handle for a planar module tray interfacing with a damping material and with a front module tray according to at least one embodiment of the present disclosure.
Figure 11:
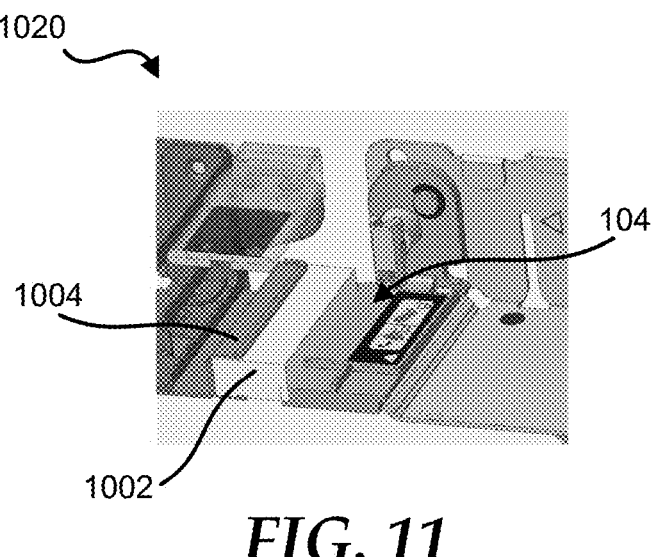
FIG. 11 is a diagram of a portion of a handle for a planar module tray interfacing with a damping material and with a front module tray according to at least one embodiment of the present disclosure.

FIG. 10 illustrates a portion of a front module tray 1000, a damping material 1002, and a portion of planar module tray 100 according to at least one embodiment of the present disclosure. Front module tray 1000 includes multiple components 1010. Damping material 1002 may be secured to front module tray 1000 via a mounted clamp 1004. In an example, damping material 1002 may be inserted into mounted clamp 1004 and held in place by top and bottom portions of the mounted clamp as illustrated in FIG. 11, which shows a section 1020 of the mounted clamp, the damping material, and handle 104.

As illustrated in FIG. 10, tabs 606 and 608 of handle 104 may be in physical communication with damping material 1002. This physical communication may create an air seal between bottom module tray 802 of FIG. 8 and the combination of front module tray 1000 and planar module tray 100. In an example, the air seal may prevent hot air flow from bottom module tray 802 of FIG. 8 from entering in planar module tray 100, and thereby prevent an increase in air temperature around components 822 of FIG. 8 within the planar module tray. The air seal may also enable an air flow 1040 from front module tray 1000 to planar module tray 100 without a portion of air flow 1040 from entering bottom module tray 802 of FIG. 8. In certain examples, holes or gaps 1030 and 1032 may be formed between damping material 1002 and tabs 606 and 608 of handle 104. These holes or gaps 1030 and 1032 may enable large cable to be routed among bottom module tray 802 of FIG. 8 to front module tray 1000 and/or planar module tray 100.

FIG. 12 shows a generalized embodiment of an information handling system 1200 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1200 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1200 can include processing resources for executing machine-executable code, such as a central processing unit (CPU), a programmable logic array (PLA), an embedded device such as a System-on-a-Chip (SoC), or other control logic hardware. Information handling system 1200 can also include one or more computer-readable medium for storing machine-executable code, such as software or data. Additional components of information handling system 1200 can include one or more storage devices that can store machine-executable code, one or more communications ports for communicating with external devices, and various input and output (I/O) devices, such as a keyboard, a mouse, and a video display. Information handling system 1200 can also include one or more buses operable to transmit information between the various hardware components.

Information handling system 1200 can include devices or modules that embody one or more of the devices or modules described below and operates to perform one or more of the methods described below. Information handling system 1200 includes a processors 1202 and 1204, an input/output (I/O) interface 1210, memories 1220 and 1225, a graphics interface 1230, a basic input and output system/universal extensible firmware interface (BIOS/UEFI) module 1240, a disk controller 1250, a hard disk drive (HDD) 1254, an optical disk drive (ODD) 1256, a disk emulator 1260 connected to an external solid state drive (SSD) 1262, an I/O bridge 1270, one or more add-on resources 1274, a trusted platform module (TPM) 1276, a network interface 1280, a management device 1290, and a power supply 1295. Processors 1202 and 1204, I/O interface 1210, memory 1220, graphics interface 1230, BIOS/UEFI module 1240, disk controller 1250, HDD 1254, ODD 1256, disk emulator 1260, SSD 1262, I/O bridge 1270, add-on resources 1274, TPM 1276, and network interface 1280 operate together to provide a host environment of information handling system 1200 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1200.

In the host environment, processor 1202 is connected to I/O interface 1210 via processor interface 1206, and processor 1204 is connected to the I/O interface via processor interface 1208. Memory 1220 is connected to processor 1202 via a memory interface 1222. Memory 1225 is connected to processor 1204 via a memory interface 1227. Graphics interface 1230 is connected to I/O interface 1210 via a graphics interface 1232 and provides a video display output 1236 to a video display 1234. In a particular embodiment, information handling system 1200 includes separate memories that are dedicated to each of processors 1202 and 1204 via separate memory interfaces. An example of memories 1220 and 1230 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1240, disk controller 1250, and I/O bridge 1270 are connected to I/O interface 1210 via an I/O channel 1212. An example of I/O channel 1212 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1210 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 1240 includes BIOS/UEFI code operable to detect resources within information handling system 1200, to provide drivers for the resources, initialize the resources, and access the resources. BIOS/UEFI module 1240 includes code that operates to detect resources within information handling system 1200, to provide drivers for the resources, to initialize the resources, and to access the resources.

Disk controller 1250 includes a disk interface 1252 that connects the disk controller to HDD 1254, to ODD 1256, and to disk emulator 1260. An example of disk interface 1252 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1260 permits SSD 1264 to be connected to information handling system 1200 via an external interface 1262. An example of external interface 1262 includes a USB interface, an IEEE 12394 (Firewire) interface, a proprietary interface, or a combination thereof. Alternatively, solid-state drive 1264 can be disposed within information handling system 1200.

I/O bridge 1270 includes a peripheral interface 1272 that connects the I/O bridge to add-on resource 1274, to TPM 1276, and to network interface 1280. Peripheral interface 1272 can be the same type of interface as I/O channel 1212 or can be a different type of interface. As such, I/O bridge 1270 extends the capacity of I/O channel 1212 when peripheral interface 1272 and the I/O channel are of the same type, and the I/O bridge translates information from a format suitable to the I/O channel to a format suitable to the peripheral channel 1272 when they are of a different type. Add-on resource 1274 can include a data storage system, an additional graphics interface, a network interface card (NIC), a sound/video processing card, another add-on resource, or a combination thereof. Add-on resource 1274 can be on a main circuit board, on separate circuit board or add-in card disposed within information handling system 1200, a device that is external to the information handling system, or a combination thereof.

Network interface 1280 represents a NIC disposed within information handling system 1200, on a main circuit board of the information handling system, integrated onto another component such as I/O interface 1210, in another suitable location, or a combination thereof. Network interface device

1280 includes network channels 1282 and 1284 that provide interfaces to devices that are external to information handling system 1200. In a particular embodiment, network channels 1282 and 1284 are of a different type than peripheral channel 1272 and network interface 1280 translates information from a format suitable to the peripheral channel to a format suitable to external devices. An example of network channels 1282 and 1284 includes InfiniBand channels, Fibre Channel channels, Gigabit Ethernet channels, proprietary channel architectures, or a combination thereof. Network channels 1282 and 1284 can be connected to external network resources (not illustrated). The network resource can include another information handling system, a data storage system, another network, a grid management system, another suitable resource, or a combination thereof.

Management device 1290 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 1200. In particular, management device 1290 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1200, such as system cooling fans and power supplies. Management device 1290 can include a network connection to an external management system, and the management device can communicate with the management system to report status information for information handling system 1200, to receive BIOS/UEFI or system firmware updates, or to perform other task for managing and controlling the operation of information handling system 1200.

Management device 1290 can operate off of a separate power plane from the components of the host environment so that the management device receives power to manage information handling system 1200 when the information handling system is otherwise shut down. An example of management device 1290 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1290 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A planar module tray comprising:
a bottom panel;
a first side panel in physical communication with a first edge of the bottom panel;
a second side panel in physical communication with a second edge of the bottom panel;
a handle in physical communication with and securely mounted on both of the first and second side panels, wherein the handle is configured to transition between a horizontal position and a vertical position, when the handle is in the horizontal position the handle is in physical communication with the bottom panel, when the handle is in the vertical position the handle is perpendicular to the bottom panel; and
a first cable routing component to hold and route a first set of cables into the planar module tray.

2. The planar module tray of claim 1, further comprising: a plunger lock to transition between a locked position and an unlocked position; when the plunger lock is in the locked position, the plunger lock to hold the handle in either the horizontal position or the vertical position; and when the plunger lock is in the unlocked position, the plunger lock to enable the handle to transition between the horizontal position and the vertical position.

3. The planar module tray of claim 2, wherein the plunger lock includes a pin; when the handle is in the horizontal position, the pin extends through a first locking hole of the first side panel; and when the handle is in the vertical position, the pin extends through a second locking hole of the first side panel.

4. The planar module tray of claim 1, wherein the first cable routing component includes first, second, and third mounts, wherein the second mount is equidistance from the first and second mounts.

5. The planar module tray of claim 1, further comprising: a second cable routing component to hold and route a second set of cables into the planar module tray.

6. The planar module tray of claim 5, wherein the second cable routing component includes first and second mounts, wherein each of the first and second mounts include respective openings to enable different cables of the second set of cables to be inserted through the second cable touring component.

7. The planar module tray of claim 1, further comprising: a tab to create an air flow seal to the planar module tray.

8. An information handling system comprising:
a front module tray;
a damping material in physical communication with the front module tray; and
a planar module tray, the planar module tray includes:
a bottom panel;
a first side panel in physical communication with a first edge of the bottom panel;
a second side panel in physical communication with a second edge of the bottom panel; and
a handle in physical communication with and securely mounted on both of the first and second side panels, wherein the handle is configured to transition between a horizontal position and a vertical position, when the handle is in the horizontal position the handle is in physical communication with the bottom panel and the damping material, when the handle is in the vertical position the handle is perpendicular to the bottom panel and the damping material.

9. The information handling system of claim 8, wherein planar module tray further includes: a plunger lock to transition between a locked position and an unlocked position; when the plunger lock is in the locked position, the plunger lock to hold the handle in either the horizontal position or the vertical position; and when the plunger lock is in the unlocked position, the plunger lock to enable the handle to transition between the horizontal position and the vertical position.

10. The information handling system of claim 9, wherein the plunger lock includes a pin; when the handle is in the horizontal position, the pin extends through a first locking hole of the first side panel; and when the handle is in the vertical position, the pin extends through a second locking hole of the first side panel.

11. The information handling system of claim 8, wherein the planar tray further includes: a first cable routing component to hold and route a first set of cables into the planar module tray.

12. The information handling system of claim 11, wherein the first cable routing component includes first, second, and third mounts, wherein the second mount is equidistance from the first and second mounts.

13. The information handling system of claim 11, wherein the planar tray further includes: a second cable routing component to hold and route a second set of cables into the planar module tray.

14. The information handling system of claim 13, wherein the second cable routing component includes first and second mounts, wherein each of the first and second mounts include respective openings to enable different cables of the second set of cables to be inserted through the second cable touring component.

15. The information handling system of claim 14, wherein the planar tray further includes: a tab, wherein the tab is in physical communication with the damping material when the handle is in the horizontal position, wherein the tab and the damping material combine to create an air flow seal between the front module tray and the planar module tray.

16. An information handling system comprising:
a front module tray;
a damping material in physical communication with the front module tray; and
a planar module tray, the planar module tray includes:
a bottom panel;
a first side panel in physical communication with a first edge of the bottom panel;
a second side panel in physical communication with a second edge of the bottom panel;
a handle in physical communication with and securely mounted on both of the first and second side panels, wherein the handle is configured to transition between a horizontal position and a vertical position, when the handle is in the horizontal position the handle is in physical communication with the bottom panel and the damping material, when the handle is in the vertical position the handle is perpendicular to the bottom panel and the damping material;
a plunger lock to transition between a locked position and an unlocked position; when the plunger lock is in the locked position, the plunger lock to hold the handle in either the horizontal position or the vertical position; and when the plunger lock is in the unlocked position, the plunger lock to enable the handle to transition between the horizontal position and the vertical position; and
a tab in physical communication with the damping material when the handle is in the horizontal position, wherein the tab and the damping material combine to create an air flow seal between the front module tray and the planar module tray.

17. The information handling system of claim 16, wherein the plunger lock includes a pin; when the handle is in the horizontal position, the pin extends through a first locking hole of the first side panel; and when the handle is in the vertical position, the pin extends through a second locking hole of the first side panel.

18. The information handling system of claim 16, wherein the planar tray further includes: a first cable routing component to hold and route a first set of cables into the planar module tray, wherein the first cable routing component includes first, second, and third mounts, wherein the second mount is equidistance from the first and second mounts.

19. The information handling system of claim 18, wherein the planar tray further includes: a second cable routing component to hold and route a second set of cables into the planar module tray, wherein the second cable routing component includes fourth and fifth mounts, wherein each of the fourth and fifth mounts include respective openings to enable different cables of the second set of cables to be inserted through the second cable touring component.

\*   \*   \*   \*   \*